United States Patent [19]

Ogura et al.

[11] Patent Number: 4,725,985
[45] Date of Patent: Feb. 16, 1988

[54] CIRCUIT FOR APPLYING A VOLTAGE TO A MEMORY CELL MOS CAPACITOR OF A SEMICONDUCTOR MEMORY DEVICE

[75] Inventors: Mitsugi Ogura; Fujio Masuoka, both of Yokohama, Japan

[73] Assignee: Kabushiki Kaisha Toshiba, Kawasaki, Japan

[21] Appl. No.: 667,162

[22] Filed: Nov. 1, 1984

[30] Foreign Application Priority Data

Nov. 9, 1983 [JP] Japan ................. 58-210099

[51] Int. Cl.$^4$ .............................................. G11C 7/00
[52] U.S. Cl. ..................................... 365/201; 365/149
[58] Field of Search ................. 365/149, 226, 201

[56] References Cited

U.S. PATENT DOCUMENTS 4,380,803  4/1983  Tuan ..................... 365/149 X
4,418,403  11/1983  O'Toole et al. ............. 365/201

FOREIGN PATENT DOCUMENTS 0113187  7/1984  European Pat. Off. ........... 365/149

Primary Examiner—Joseph A. Popek
Attorney, Agent, or Firm—Finnegan, Henderson, Farabow, Garrett & Dunner

[57] ABSTRACT

A voltage applying circuit is adapted to a semiconductor memory device comprising a plurality of memory cells which each include MOS memory capacitors one terminal of each being connected to a common point. The output terminal of the voltage applying circuit is connected to the common point of the MOS capacitor, and a low voltage for normal operation of the MOS capacitor and a screening voltage for distinguishing a memory device, which is higher than that voltage, are selectively applied to the common connection point.

4 Claims, 4 Drawing Figures

CIRCUIT FOR APPLYING A VOLTAGE TO A MEMORY CELL MOS CAPACITOR OF A SEMICONDUCTOR MEMORY DEVICE

BACKGROUND OF THE INVENTION

This invention relates to a circuit for applying a voltage to a MOS capacitor memory cell in a semiconductor memory device.

Recent dynamic type memory devices use memory cells, which include MOS capacitors for memory elements having extremely thin insulation films and MOS transistors for transfer gates. These MOS capacitors are constructed of an ultra thin insulation film with one of the electrodes formed on the semiconductor substrate, and the other electrode formed on the insulation layer. The electrode formed on the substrate is connected to a transfer gate MOS transistor and the electrode formed on the insulation film is connected to the power source Vcc, which applies an external voltage. This external voltage is necesary to form a strong inversion state in the substrate surface region of the MOS capacitor.

Memory cells are increasingly being required to store a large number of charges, and with advances in ion implantation technology, there are many cases of changing MOS capacitors from enhancement types to depletion types. In this situation, the surface region of the substrate of the MOS capacitor is normally in the inverted state so that it is necesary to connect one electrode to a voltage source Vcc. Of course, in order to prevent deterioration or damage to the insulation film and to prevent the operation of the memory cell from being affected by momentary fluctuations in the voltage power source Vcc, it is preferable that the voltage of the electrode formed on the substrate be less than Vcc, e.g., the same as ground Vss or ½ of Vcc. (This is described in U.S. Pat. No. 4,225,945.)

In the actual mass production of memory devices, in particular, faults in the insulation film will occur, but which still allow the device to operate. In order to ensure the quality of the memory devices it is important to screen for faulty goods before shipment. This screening presently consists of a variety of different stress application tests such as a bias-temperature (B-T) test and a regular test (normal operation test) in the case of LSI (large scale integration) memory. These tests are stress accelerated tests in which a voltage (e.g. 7-8 V), which is higher than the normal operation voltage (e.g. 5 V) is applied. In these kinds of tests, when there is a fault in the insulation film, the fault will forcibly be destroyed so that faulty goods can be screened.

This screening, which applies a high external voltage, cannot be applied to LSI memory devices in which the MOS capacitor of the memory cell has a low voltage of ground, Vss, or ½ of Vcc applied. There remains, then, the problem of maintaining product quality in LSI memory devices. Also, with LSI memory in which a voltage of ½ Vcc is applied to the MOS capacitor, the burn-in time must be increased to raise the reliability of the screening, which results in an increase in overall production time and test costs, as well as requiring various test equipment such as a thermostatic chamber for the burn-in test.

SUMMARY OF THE INVENTION

Therefore, one purpose of this invention is to provide a circuit for applying a voltage to a MOS capacitor of a semiconductor memory device in which the operation of the memory cell is not affected by momentary fluctuations in the operating power voltage and in which deterioration and damage to the insulation film of the MOS capacitor of the memory is prevented and, furthermore, highly reliable screening of faulty goods is possible.

There is provided a voltage applying circuit adapted to a semiconductor memory device comprising a plurality of memory cells which each include a MOS memory capacitor, one terminal of each being connected to a common point, and characterized in that the output terminal of said voltage applying circuit is connected to said common point of said MOS capacitor, and a low voltage for normal operation of said MOS capacitor or a screening voltage for distinguishing a memory device, which is higher than said voltage, are selectively applied to said common connection point.

DETAILED DESCRIPTION OF THE PREFERRED EMBODIMENT

The following is a description of the first embodiment of the invention given in reference to the drawings.

Figure 1:
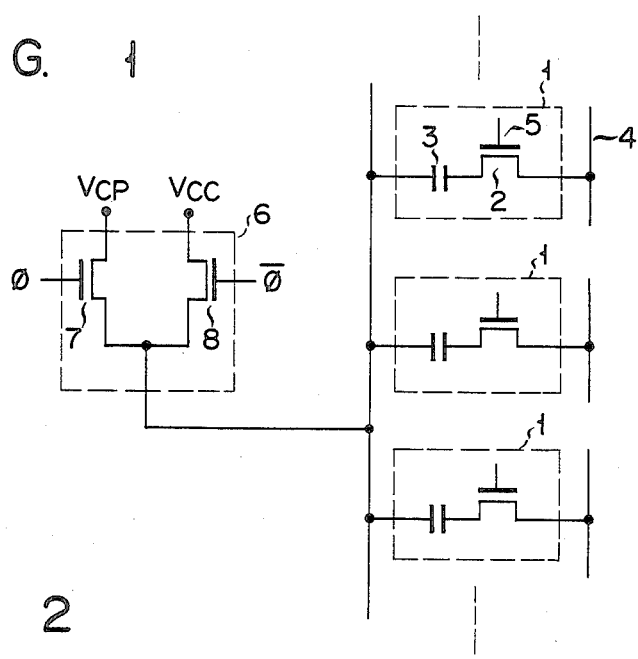
FIG. 1 shows the voltage applying circuit of the first embodiment of the invention together with a dynamic memory device.

In FIG. 1, the reference numeral 1 refers to dynamic type memory cells of a LSI memory device, which are each formed of a series circuit having one MOS capacitor and one MOS transistor. For example, memory cell 1 is formed of a series circuit having a MOS transistor 2 and MOS capacitor 3. One terminal of the MOS transistor 2 (source) is connected to one of the electrodes (the electrode on the substrate) of MOS capacitor 3. The other electrode of the MOS transistor 2 (drain) is connected to bit line 4, and the gate is connected to row selecting line 5. The other electrode of MOS capacitor 3 (the electrode on the insulation film) is commonly connected to a corresponding electrode of MOS capacitor 3 of another memory cell.

The voltage applying circuit is constructed of two N channel enhancement type MOS transistor 7 and 8. One terminal of MOS transistors 7 and 8 is connected to a common connection point of each of the MOS capacitors. Low voltage Vcp and power source voltage Vcc are respectively applied to one terminal of each MOS transistor 7 and 8, and control signals $\phi$ and $\overline{\phi}$ are respectively applied to the gates. Voltage Vcp is the low voltage, i.e., ground voltage, Vss, or ½ Vcc, which is applied during normal operation to the one terminal of MOS capacitor 3, Vcc is the normal power source voltage, control signal $\phi$ is signal which become high level during normal operation of the memory cell and low level during screening, and $\overline{\phi}$ is the inverse signal of $\phi$. When MOS transistors 7, 8 receive control signals $\phi$, $\overline{\phi}$, one of them is turned ON. Voltage Vcc or Vcp, which is connectd to either turned-on MOS transistor 7 or 8, is supplied to the common node of MOS capacitor 3. In other words, voltage applying circuit 6 has the function of a voltage switching circuit.

Figure 2:
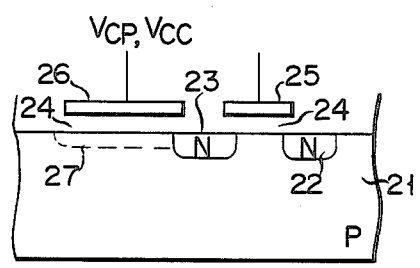
FIG. 2 is a cross section of the memory cell of FIG. 1.

FIG. 2 shows a practical example of the memory cell of FIG. 1. Reference numeral 21 denotes a P conductivity type semiconductor substrate in which N type regions 22, 23, which become the source and drain, respectively, are formed. A gate insulation film 24 is formed on the substrate 21. A gate electrode 25 for MOS transistor 2 is formed on the part of insulation film 24 that corresponds to the channel region between the N regions 22, 23. One electrode 26 for MOS capacitor 3 is formed on the part of insulation film 24 that corresponds to the channel region on the other side of N region 23. MOS transistor 5 is constructed of substrate 21, drain region 22, source region 23, insulation film 24 and gate electrode 25, and MOS capacitor 3 is constructed of substrate 21, insulation film 24 and electrode 26. The dotted line in FIG. 2 shows the inverted layer 27, which is formed on the substrate surface region underneath MOS capacitor electrode 26.

When a voltage of ½ Vcc is applied to electrode 26 as the low voltage Vcp, the substrate surface region of the MOS capacitor 3 area becomes a strong inverted state so MOS capacitor 3 may be an enhancement or depletion type. However, when voltage Vss is applied as the voltage Vcp, the substrate surface region does not become a strong inverted state so the MOS capacitor 3 is restricted to a depletion type.

With this kind of LSI memory, the voltage applying circuit 6 is set such that transistor 7 is ON and transistor 8 is OFF during normal operation, and a low voltage Vcp is supplied to the electrode of MOS capacitor 3 on the insulation film by way of transistor 7. Accordingly, there is no deterioration or damage to the insulation film 24 and, even if there are momentary fluctuations in the operating voltage source Vcc, the memory cell is not affected because the Vcc voltage is not applied to MOS capacitor 3.

For screening, on the other hand, transistor 7 is OFF and transistor 8 is ON so that a power source voltage Vcc, which is a high voltage, is applied to the MOS capacitor 3 via transistor 8. Compared with screening that is done using a low voltage, it is much more accurate and reliable to screen for faults using a high voltage.

Figure 3:
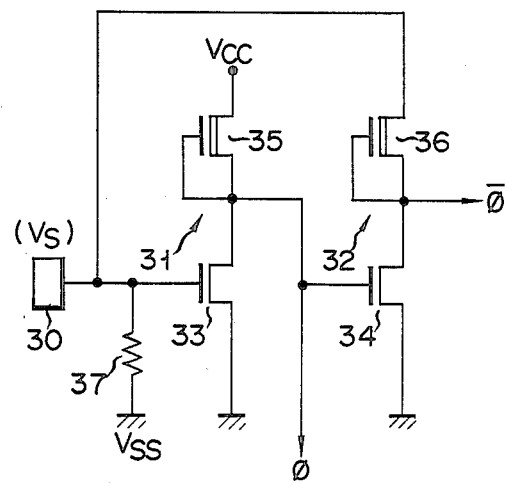
FIG. 3 shows an example of a circuit which generates control signals $\phi$, $\overline{\phi}$, which are supplied to the voltage applying circuit of FIG. 1.

FIG. 3 shows an example of a control signal generating circuit, which is used for carrying out screening when the LSI memory is in the wafer state of completion. This circuit is formed on the same chip as the memory cell. In FIG. 3, reference numeral 30 denotes a pad for receiving the screening control voltage Vs. The input terminal of the first E/D (enhancement/depletion) inverter 31 is connected to pad 30, and the output terminal is connected to a second E/D inverter 32. The first E/D inverter 31 is constructed of an N channel enhancement type driver MOS transistor 33 and an N channel depletion type load MOS transistor 35. The source of the driver transistor 33 is connected to the ground VSS and the drain is connected to the source of the load transistor 35, while the gate is connected to pad 30. The drain of load transistor 35 is connected to the power source voltage Vcc and the gate is connected to the source. The second E/D inverter 32 is constructed in the same way as the first E/D inverter, i.e., it is constructed of an N channel enhancement type drive MOS transistor 34 and an N channel depletion type load MOS transistor 36. The source of driver transistor 34 is connected to ground Vss, the drain is connected to the source of the load transistor 36, and the gate is connected to the mutual junction of the transistors 33 and 35 of the first E/D inverter 31. The drain of load transistor 36 is connected to pad 30 and the gate is connected to the source. A control signal $\phi$ is obtained from the output terminal of the first E/D inverter 31, i.e., from the mutual junction of transistors 33 and 35, and the control signal $\overline{\phi}$ is obtained from the output terminal of the second E/D inverter 32, i.e., from the mutual junction of the transistors 34 and 36. A resistor is connected between pad 30 and ground Vss.

With this kind of construction, when screening is carried out at the wafer stage of completion of the device, a screening voltage Vs, which is higher than the power source voltage Vcc, is applied to pad 30. Accordingly, in this case, the driver transistor 33 of the first inverter 31 is ON and the potential of the output signal $\phi$ of the first inverter 31 is Vss and, therefore, the drive transistor 34 of the second inverter 32 is OFF and, accordingly, the output signal $\overline{\phi}$ of the second inverter 32 becomes level Vs. Consequently, the voltage Vcc is applied to the memory cell 1, i.e., to one terminal of the MOS transistor 3 via transistor 8.

During normal operation, after a chip has been housed in a package, a control voltage Vs is not applied and, accordingly, voltage Vss is applied to the input terminal of the first inverter 31 via resistor 37, and the potential of the output signal becomes substantially Vss, as does the potential of the output signal $\overline{\phi}$ of the second inverter 32. Consequently, a low voltage Vcp is applied to each MOS capacitor 31 of the memory cells 1 via transistor 7.

Figure 4:
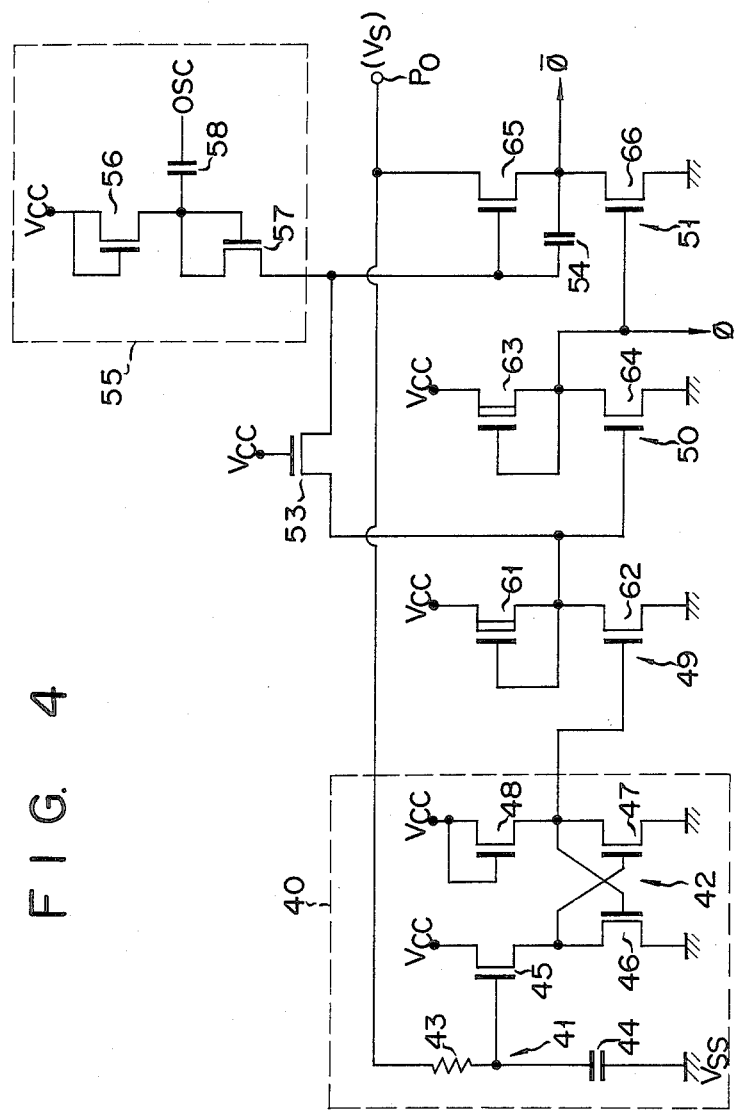
FIG. 4 shows another embodiment of the control signal generating circuit.

FIG. 4 shows an example of a control signal generating circuit which is used in screening when the LSI memory chip is housed in a ceramic or plastic package. This circuit is formed on the same chip as the memory cells. With this circuit, as well, one of the data output pins Po, not a special external pin, is used for applying the screening control voltage Vs. It is also possible to use an input pin and not just the output pin Po.

In FIG. 4, the reference numeral 40 denotes a discriminating circuit 40, which is determining whether a screening control voltage (normally higher than the power source voltage) is applied to the data output pin Po. This circuit is constructed of an RC filter circuit 41 whose input terminal is connected to the Po pin, and a flip-flop circuit 42, which is connected to the output side of the filter circuit 41. Filter circuit 41 is constructed of a resistor 43, one terminal of which is connected to pin Po, and a capacitor 44, which is connected between the terminal of resistor 43 and Vss. Flip-flop circuit 42 is constructed of N channel enhancement MOS transistors 45, 46, 47 and 48, and uses voltage Vcc as the operating voltage source. The drain of transistor 45 is connected to voltage Vcc and the source is connected to the drain of transistor 46, while the gate is connected to the common junction of the capacitor 41 and resistor 43. The source of transistor 46 is connected to voltage Vss. The drain of transistor 48 is connected to Vcc and the source is connected to transistor 47 while the gate of transistor 48 is connected to the drain. The source of transistor 47 is connected to voltage Vss. The gate of transistor 46 is connected to the junction of transistors 47 and 48 and the gate is connected to the junction of the transistors 45 and 46.

The first E/D inverter 49 comprising MOS transistors 61 and 62 is connected to the output terminal of the discriminating circuit 40, i.e., the output terminal of the flip-flop circuit 42, and the second E/D converter 50 comprising MOS transistors 63 and 64 is connected in a later stage. The third E/D inverter 51 comprising MOS transistors 65 and 66 is connected after that. The voltage Vcc is used as the operating voltage source for the first and second inverters 49 and 50. The output signal of the second inverter 50 is output as the control signal $\phi$ and the voltage Vs, which is applied to the pin Po as the operating voltage source, is applied to the third inverter 51 the output signal of which is output as the control signal $\bar{\phi}$. N channel enhancement type MOS transistor 53, to the gate of which voltage Vcc is applied, is connected between the output terminal of the first inverter 49 and the gate of the N channel enhancement type load MOS transistor 65 of the third inverter 51. A bootstrap capacitor 54 is connected between the gate of the transistor 65 and the source (output terminal). A level-keep circuit 55 is connected to the gate of transistor 52 to supply a voltage higher than Vcc to that gate. This level-keep circuit 55 is constructed of N channel enhancement type MOS transistors 56, 57 and charge/discharge capacitor 58. The drain of transistor 56 is connected to voltage Vcc and the source is connected to the drain of transistor 57 to which is also connected the gate of transistor 56. The source of transistor 57 is connected to the gate of transistor 52. The gate of transistor 57 is connected to the drain of transistor 56. One end of capacitor 58 is connected to the mutual junction of transistors 56 and 57 and the other end is connected to an oscillator OSC (not shown) for receiving its pulse signal. Capacitor 58 is charged/discharged in response to this input pulse signal to output a voltage twice that of the power source voltage Vcc. It is possible to use a self-bias circuit for the above oscillator.

Although not shown, a data output buffer is connected to the output pin Po and, during normal operation of the memory, the voltage at the pin Po does not rise above Vcc.

In the screening mode, namely, when an external screening control high voltage Vs, which is higher than Vcc, is applied to the data output pin Po of the circuit in FIG. 4, the gate voltage of the transistor 45 becomes higher than the gate voltage Vcc of transistor 48 in the flip-flop circuit 42 of the discriminating circuit 40 so the flip-flop circuit 42 is set, transistor 47 turns ON, transistor 46 turns OFF, and the output of flip-flop circuit 42 becomes Vss. With this the output voltage of the first inverter 49 becomes substantially Vcc, the output signal $\phi$ of the second inverter 50 becomes Vss, and in the third inverter 51, double the Vcc is applied to the gate of transistor 65 from the level-keep circuit 55. The bootstrap action of capacitor 54 causes the output signal $\bar{\phi}$ to become Vs. Accordingly, transistor 7 in the voltage applying circuit of FIG. 1 is turned OFF, the transistor 8 is ON, and the voltage Vcc is applied to MOS capacitor 3 of the memory cell 1 via transistor 8.

In order that the voltage Vs, which is applied to pin Po, not be disturbed by the data output buffer during screening, the level of the control signals $\phi$ (Voltage Vss) and $\bar{\phi}$ (Voltage Vs) is detected by control level detecting circuit (not shown) and, based on the result, the data output buffer is turned OFF. With the circuit shown in FIG. 4, the gate voltage of transistor 45 of the flip-flop circuit 42 of the discriminating circuit 40 is lower than the gate voltage Vcc transistor 48 during normal operation, so the flip-flop circuit is reset, transistor 46 turns ON, transistor 45 turns OFF, transistor 47 turns OFF, and the output goes to a high level. Then, the output of first inverter 49 becomes low level, the output signal $\phi$ of the second inverter 50 becomes substantially Vcc, and the output signal $\phi$ of the third inverter 51 becomes Vss, so a low voltage Vcp is applied to the memory cell 1 of the LSI memory in FIG. 1 via transistor 7.

The resistor 43 and capacitor 41 of the filter circuit 41 of the discriminating circuit 40 determine the CR time constant such that flip-flop circuit 42 does not respond to short cyclical fluctuations in the input voltage (the voltage applied to the data output pin Po). Also, with the circuit of FIG. 4, the determination of whether the circuit is being screened or not is based on the voltage value of the data output pin Po. It is, however, possible to apply a screening control voltage that is higher than the high level of the address signal to the address pin, and to determine whether the circuit is being screened or not based on the logic level of the address signal and the screening control voltage level.

As was described above, according to the voltage applying circuit of this invention, it is possible to distinguish, i.e., screen faulty memory circuits with a high degree of accuracy without deteriorating or damaging the insulation film of the MOS capacitor and prevent the operation of the memory cells from being affected by momentary fluctuations in the operating power source. Accordingly, it is possible to ensure the quality of shipped goods and to vastly reduce the time required for the burn-in of the memory device. This in turn reduces production time, reduces test costs and reduces the scale of the testing equipment, such as thermostatic chambers, required for the burn-in test.

What is claimed is:

1. A semiconductor memory device comprising:
   a plurality of dynamic memory cells, each of the dynamic memory cells comprising a MOS memory capacitor and a transfer MOS transistor, one terminal of the MOS memory capacitor being connected to one terminal of the source-drain path of the transfer MOS transistor, the other terminal of the source-drain path of the transfer MOS transistor being connected to a bit line, and the gate of the transfer MOS transistor being connected to a word line; and
   a voltage-applying circuit having an output terminal, the output terminal being connectd to the other terminal of said MOS memory capacitor of each of said plural MOS memory cells, the voltage-applying circuit having means for selectively applying through said output terminal to said other terminal of the MOS memory capacitor of each of the plural MOS memory cells a first voltage for screening the MOS memory capacitors and a second voltage for operating the MOS memory capacitors, the first voltage for screening the MOS memory capacitors being higher than the second voltage for operating the MOS memory capacitors and being sufficient to detect any faulty MOS memory capacitors.

2. A semiconductor memory device according to claim 1, where said MOS memory capacitors are of the depletion type.

3. A semiconductor memory device according to claim 1, wherein said MOS memory capacitors are of the enhancement type.

4. A semiconductor memory device according to claim 1, wherein said first voltage is a power source voltage and said second voltage is substantially half said power source voltage.

* * * * *